(12) United States Patent
Pforr et al.

(10) Patent No.: US 6,466,373 B1
(45) Date of Patent: Oct. 15, 2002

(54) TRIMMING MASK WITH SEMITRANSPARENT PHASE-SHIFTING REGIONS

(75) Inventors: Rainer Pforr, Dresden; Christoph Friedrich, München; Klaus Ergenzinger, Oberhaching; Fritz Gans; Uwe Griesinger, both of München; Wilhelm Maurer, Hohenbrunn-Riemerling; Jürgen Knobloch, München, all of (DE)

(73) Assignee: Siemens Aktiengesellschaft, Munich (DE)

( * ) Notice: Subject to any disclaimer, the term of this patent is extended or adjusted under 35 U.S.C. 154(b) by 10 days.

(21) Appl. No.: 09/677,321

(22) Filed: Sep. 29, 2000

Related U.S. Application Data
(60) Provisional application No. 60/158,193, filed on Oct. 7, 1999.

(51) Int. Cl.[7] .............................. G02B 27/00; G03F 9/00
(52) U.S. Cl. ........................... 359/577; 359/558; 430/5
(58) Field of Search ............................... 359/569, 580, 359/590, 893, 577, 558; 355/53, 125; 430/5

(56) References Cited

U.S. PATENT DOCUMENTS

| | | | |
|---|---|---|---|
| 5,134,058 A | | 7/1992 | Han |
| 5,248,575 A | * | 9/1993 | Ogoshi ........................ 430/5 |
| 5,308,741 A | | 5/1994 | Kemp |
| 5,316,878 A | | 5/1994 | Saito et al. |
| 5,328,807 A | | 7/1994 | Tanaka et al. |
| 5,418,092 A | * | 5/1995 | Okamoto ........................ 430/5 |
| 5,521,033 A | * | 5/1996 | Okamoto ........................ 430/5 |
| 5,523,186 A | * | 6/1996 | Lin et al. ........................ 430/5 |
| 5,789,116 A | | 8/1998 | Kim |
| 5,795,685 A | * | 8/1998 | Liebmann et al. ............. 430/5 |
| 5,851,703 A | | 12/1998 | Hasegawa et al. |
| 5,936,707 A | * | 8/1999 | Nguyen et al. ................ 355/18 |
| 6,057,065 A | * | 5/2000 | Rolson ........................... 430/5 |
| 6,277,527 B1 | * | 8/2001 | O'Grady et al. ............... 430/5 |

FOREIGN PATENT DOCUMENTS

| | | |
|---|---|---|
| EP | 0 620 498 A1 | 10/1994 |
| EP | 0 810 474 A2 | 12/1997 |
| WO | WO 98/12605 | 3/1998 |

\* cited by examiner

*Primary Examiner*—Jon Henry
(74) *Attorney, Agent, or Firm*—Laurence A. Greenberg; Werner H. Stemer; Gregory L. Mayback

(57) ABSTRACT

For lithographically producing the smallest structures at less than the exposure wavelengths in semiconductor fabrication, a double exposure is carried out using a thick phase mask and a trimming mask, the trimming mask further structures the phase-contrast lines produced by the phase mask. Besides transparent or opaque regions, the trimming mask also has phase-shifting regions. These surround transparent regions of the trimming mask through which the phase-contrast lines produced by the first mask are locally re-exposed, that is to say interrupted. The intensity profile of successive line sections is especially rich in contrast through the addition of the phase-shifting partially transparent regions on the second mask; the distances between the line sections can be reduced. The trimming mask, otherwise used only for larger structures, is therefore suitable for the configuration of the finest dimensionally critical structures.

11 Claims, 1 Drawing Sheet

Area A

Area B

Area C

Area A

Area B

Area C

Area A

Area B

Area C

TRIMMING MASK WITH SEMITRANSPARENT PHASE-SHIFTING REGIONS

CROSS-REFERENCE TO RELATED APPLICATION

This application claims the priority of Provisional Application Serial No. 60/158,193, filed Oct. 7, 1999.

BACKGROUND OF THE INVENTION

Field of the Invention

The invention relates to a mask set containing at least two masks coordinated with one another for projection onto the same surface. A first mask has transparent first regions and second regions, which phase-shift in relation thereto for producing dimensionally critical structures, and a second mask has transparent regions and opaque regions for producing further structures. The invention further relates to a process for lithographically structuring a surface. In the process the two masks are projected onto the surface, the transparent first regions and second regions, which phase-shift in relation thereto, being disposed on the first mask in order to produce dimensionally critical structures, and the transparent regions and opaque regions disposed on a second mask for producing further structures.

During the lithographic structuring of resist layers which is carried out in semiconductor fabrication, use is made of phase masks with which, through the use of phase contrasts, structures whose dimensions are of the same order of magnitude or even smaller than the exposure wavelength used, are exposed. The phase contrasts are, for example, created by height steps between mask fields, i.e. by different mask thicknesses. When such masks are projected, shadow lines with a large process window, i.e. with a large tolerance relative to variations in the exposure intensity or in the projection focusing are formed by destructive interference below the height steps, which usually produce a phase change of half the exposure wavelength. The destructive interference at the height steps causes the formation of phase-contrast lines with a width below the exposure wavelength. With such a phase mask, it is possible to produce the smallest dimensionally critical structures.

Since height steps only occur between mask fields of normal thickness and mask fields of increased or reduced thickness, the phase-contrast lines projected by phase masks are always closed on themselves. When more complex patterns with branch line structures and line ends need to be produced, use is made of so-called trimming masks which are projected in addition to the first mask onto the surface to be exposed and resolve the phase conflicts due to the structure. The known trimming masks having optically transparent regions that are bounded by a chromium layer and are projected onto the already exposed phase-contrast lines and structure them further. With the aid of the chromium layer, it is further possible to expose other structures of not so small and therefore noncritical dimensions onto the surface. In this way, with the aid of two masks, the smallest dimensionally critical structures can be projected in addition to larger and therefore less critical structures.

However, this technique has the disadvantage that the structured phase-contrast lines, that is to say interrupted in the length direction, are separated from one another by distances that are large compared with the line width, because the chromium mask used for the trimming cannot produce such fine structures as the phase mask.

Moreover, it is not possible for the closed phase-contrast lines exposed using the phase mask to be structured with the aid of a further phase mask, because the latter would re-expose the unexposed phase-contrast lines, that is to say shadow lines, everywhere except the crossover points, and would therefore eliminate them.

SUMMARY OF THE INVENTION

It is accordingly an object of the invention to provide a trimming mask with semitransparent phase-shifting regions that overcomes the disadvantages of the prior art devices and methods of this general type, in which fine structuring phase-contrast lines which are very fine in terms of their width along the line profiles are possible.

With the foregoing and other objects in view there is provided, in accordance with the invention, a mask set, containing at least two masks, including a first mask and a second mask, coordinated with one another for projection onto a same surface. The first mask has transparent first regions and second regions which phase-shift in relation thereto for producing dimensionally critical structures. The second mask has transparent regions and opaque regions for producing further structures, and the second mask further has phase-shifting regions.

In accordance with an added feature of the invention, the phase-shifting regions of the second mask are disposed for further structuring of the dimensionally critical structures produced by the first mask.

The object is achieved, in relation to the mask set, in that the second mask has the phase-shifting regions in addition to the transparent and opaque regions. Through the addition of the phase-shifting regions, especially fine structural elements for structuring the phase-contrast lines produced during the first exposure can be produced with the aid of phase contrast. The line sections formed in this way can follow one another substantially more closely than if a merely chromium-covered trimming mask is used. In a preferred embodiment, the semitransparent phase-shifting regions of the second mask are disposed in such a way that they further structure the dimensionally critical structures produced by the first mask. Preferably, the second mask has isolated transparent and/or opaque regions with a semitransparent phase-shifting edge. Preferably, some of the transparent regions of the second mask, which are provided with a semitransparent phase-shifting edge, are used to interrupt the phase-contrast lines produced using the first mask. To that end, wherever an interruption is intended, they are disposed exactly over the exposed phase-change lines.

In a refinement of the invention, the second mask has isolated phase-shifting areas. Using these, it is possible to produce just as fine phase-contrast lines as with the first mask, although they cannot then be structured further. The isolated transparent or opaque regions with a phase-shifting edge may likewise be used to produce further structures.

The first mask need not necessarily contain only phase structures, but may have opaque regions just like the second mask. It is expedient if the phase-shifting regions of the first mask are etched more deeply or less deeply than the regions that are not phase-shifting. The phase-shifting regions of the second mask are preferably semitransparent, that is to say they transmit between 5 and 10, preferably 6% of the incident radiation. It is expedient if the phase change produced by the phase-shifting regions is approximately 180°, and therefore corresponds to a half wavelength.

With the foregoing and other objects in view there is further provided, in accordance with the invention, a process for lithographically structuring a surface. The process includes projecting at least two masks, including a first mask and a second mask, onto the surface. The first mask has transparent first regions and second regions which phase-shift in relation thereto for producing dimensionally critical structures. The second mask has transparent regions and opaque regions for producing further structures and the second mask further has phase-shifting regions.

In terms of the process, the object is achieved in that phase-shifting regions are also disposed on the second mask in addition to the transparent and/or opaque regions. The phase-shifting regions bring about an increase in the intensity gradients of the projected structures. This allows sharper projection of smaller structures than with the conventional chromium mask directed at structures of substantially larger dimension.

In one advantageous implementation, the phase-shifting regions of the second mask are disposed and projected in such a way that they further structure the dimensionally critical structures produced by the first mask. In this case, those regions of the phase-contrast line which are intended to undergo no further alteration by the second mask are protected by its chromium layer against re-exposure, so that erosion of the latent image of the first mask is avoided; the image contrast produced is preserved during the second exposure.

Advantageously, the closed phase-contrast lines are interrupted by the projection of the second mask, by locally re-exposing them through transparent regions of the second mask with semitransparent phase-shifting edges. The individual line sections can be disposed significantly closer together than when an opaque chromium mask is used, without substantially compromising the process window.

In accordance with a concomitant feature of the invention, there is the step of locally re-exposing the phase-contrast lines through the transparent regions of the second mask with semitransparent phase-shifting edges.

Lastly, spans of a dimensionally critical width are produced in a positive resist.

Other features which are considered as characteristic for the invention are set forth in the appended claims.

Although the invention is illustrated and described herein as embodied in a trimming mask with semitransparent phase-shifting regions, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
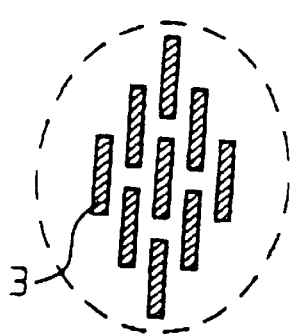
FIGS. 1a–1c are diagrammatic, views of three resist structures, to be produced with the aid of two masks, in areas A, B and C according to the invention.
Figure 2A:
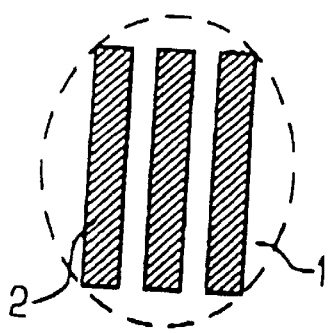
FIGS. 2a–2c show the areas of a first mask corresponding to the areas in FIGS. 1a–1c.
Figure 2B:
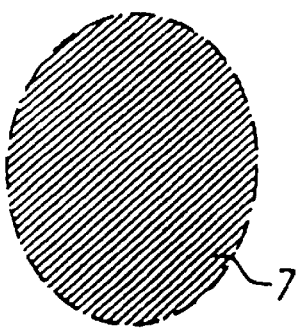
Figure 2C:
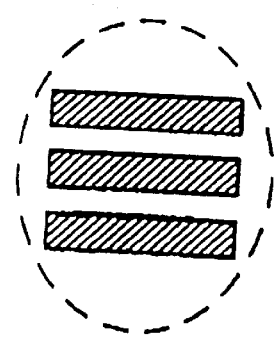
Figure 3A:
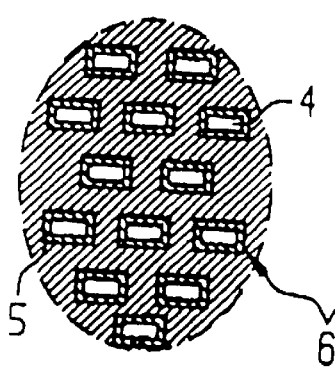
FIGS. 3a–3c show the corresponding areas of a second mask.

In all the figures of the drawing, sub-features and integral parts that correspond to one another bear the same reference symbol in each case. Referring now to the figures of the drawing in detail and first, particularly, to FIG. 1a thereof, there is shown a structure represented in area A, made up of line sections lying close together, that can be represented by combining the areas A on a first mask in FIG. 2a (a chromium-less phase mask in area A with additional chromium-covered areas in area B) and a second mask shown in FIGS. 3a–3c (a multi-tone phase mask). Further, the resist structures in area B in FIG. 1b can be represented just by using the second mask (area B in FIG. 3b), and area C in FIG. 1c just by using the first mask (area C in FIG. 2c). Areas B in FIG. 2b and C in FIG. 3c are opaque.

Since the structures in area A of the first mask are constructed as chromium-less surfaces in a chromium-less environment which phase-shift by 180 degrees, projection produces dark frame structures whose vertically running lines are further structured by a trimming mask.

The lines also need to be divided into individual line sections 3. To that end, area A of the second mask in FIG. 3a is projected onto the contour of the five lines in such a way that each of the transparent openings 6 centrally re-exposes a respective one of the lines 3. According to the invention, the second mask has phase-shifting, preferably semitransparent frame structures 6 around the transparent regions in area A. This gives rise to an especially pronounced intensity profile of the air image at the vertical boundaries of the line sections in area A of FIG. 1a, and the line sections 3 can also be disposed very close to one another in the vertical direction, without the need to reduce the process window for the exposure operations.

The remaining line sections 3 are covered by an opaque layer, for example a chromium layer 5, during the exposure through the second mask.

Figure 1B:
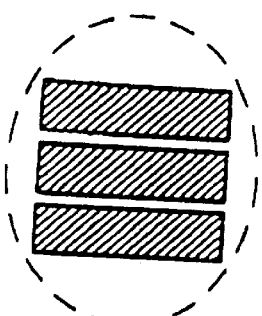
Figure 1C:
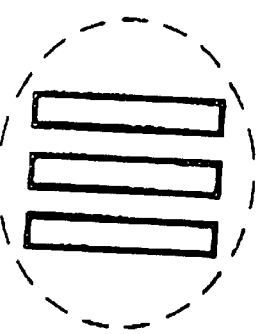
Figure 3B:
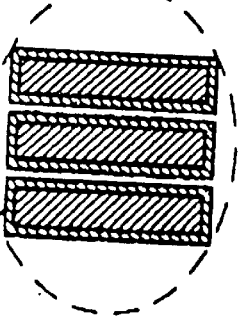
Figure 3C:
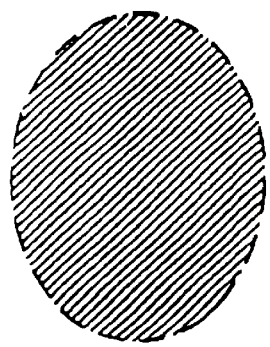

In addition, area B in FIG. 1b (horizontal resist spans) can be represented with the aid of the structures of mask area B in FIG. 3b. Area C in FIG. 1c can be represented in the same way as for a single exposure with the aid of the structures in mask area C in FIG. 2c (constructed here as chromium-less structures phase-shifting by 180°). The respective other mask is opaque in the corresponding areas.

Structures are produced in area B of FIG. 1b which are in the region of the wavelength of the light used for projection, or are larger. Resist structures are produced in the area C of FIG. 1c that are smaller than the wavelength but can be projected completely in an exposure process. The structures in area A of FIG. 1a, which are likewise smaller than the wavelength, can be produced only by overlapping exposure of the chromium-less phase areas of area A of FIG. 2a with areas A of the trimming multi-tone phase mask according to the invention (FIG. 3a).

Implementations other than those described above can be obtained by applying the knowledge and skill of the person skilled in the art.

We claim:

1. A mask set, comprising:
at least two masks, including a first mask and a second mask, coordinated with one another for projection onto a same surface, said first mask having transparent first regions and second regions which phase-shift in relation thereto for producing dimensionally critical structures, said second mask having isolated transparent regions and opaque regions for producing further structures, and at least one of said transparent regions and said opaque regions further having semitransparent phase-shifting edges disposed for further structuring of the dimensionally critical structures produced by said first mask.

2. The mask set according to claim 1, wherein said first mask produces phase-contrast lines, and said transparent regions with said semitransparent phase-shifting edges are disposed on said second mask for interrupting the phase-contrast lines produced using said first mask.

3. The mask set according to claim 1, wherein said second mask has isolated phase-shifting areas.

4. The mask set according to claim 1, wherein said first mask has opaque regions.

5. The mask set according to claim 1, wherein said second regions of said first mask are etched more deeply than said transparent first regions.

6. The mask set according to claim 1, wherein said phase-shifting regions of said second mask are semitransparent regions.

7. The mask set according to claim 6, wherein said phase-shifting regions of said second mask transmit between 5 and 10 percent of incident radiation.

8. The mask set according to claim 1, wherein said phase-shifting regions produce a phase shift of approximately 180°.

9. The mask set according to claim 1, wherein said second regions of said first mask are etched less deeply than said transparent first regions.

10. A process for lithographically structuring a surface, which comprises the steps of:

projecting at least two masks, including a first mask and a second mask, onto the surface, the first mask having transparent first regions and second regions which phase-shift in relation thereto for producing dimensionally critical structures, the second mask having isolated transparent regions and opaque regions for producing further structures and at least one of the transparent regions and the opaque regions further having semitransparent phase-shifting edges;

disposing and projecting the phase-shifting edges of the second mask for further structuring the dimensionally critical structures produced by the first mask;

forming closed phase-contrast lines with the first mask and interrupting the closed phase-contrast lines by a projection of the second mask; and locally re-exposing the phase-contrast lines through the transparent regions of the second mask with semitransparent phase-shifting edges.

11. The process according to claim 10, which comprise producing spans of a dimensionally critical width in a positive resist.

* * * * *